United States Patent [19]

Sheppard

[11] Patent Number: 4,533,624
[45] Date of Patent: Aug. 6, 1985

[54] METHOD OF FORMING A LOW TEMPERATURE MULTILAYER PHOTORESIST LIFT-OFF PATTERN

[75] Inventor: John E. Sheppard, Cornwells Heights, Pa.

[73] Assignee: Sperry Corporation, New York, N.Y.

[21] Appl. No.: 497,364

[22] Filed: May 23, 1983

[51] Int. Cl.³ .......................... G03C 5/00; G03C 5/16
[52] U.S. Cl. .................................. 430/312; 430/313; 430/314; 430/315; 430/317; 430/323; 430/324; 430/330; 430/394
[58] Field of Search ............... 430/312, 313, 314, 315, 430/317, 323, 324, 330, 394

[56] References Cited

U.S. PATENT DOCUMENTS

| | | | |
|---|---|---|---|
| 3,873,313 | 3/1975 | Horst et al. | 430/312 X |
| 4,204,009 | 5/1980 | Feng et al. | 427/36 |
| 4,256,816 | 3/1981 | Dunkleberger | 430/11 |

OTHER PUBLICATIONS

Lyman et al., J. Vac. Sci. Technol., 19(4), Nov./Dec. 1981, pp. 1325-1328.
Li et al., Conference: International Electron. Devices Meeting, Technical Digest, Washington, D.C., USA, Dec. 8-10 1980, pp. 412-414.
Todokoro, Transactions of IEEE of Japan, vol. E65, No. 1, Jan. 1982, pp. 23-27.
Hunt et al., J. Vac. Sci. Technol., 19(4), Nov./Dec. 1981, pp. 1308-1312.
Kaplan et al., IBM Technical Bulletin, vol. 15, 7, Dec. 1972, p. 2339.

*Primary Examiner*—John E. Kittle
*Assistant Examiner*—José G. Dees
*Attorney, Agent, or Firm*—John B. Sowell; Thomas J. Scott; Marshall M. Truex

[57] ABSTRACT

A novel multilayer lift-off pattern of positive and negative photoresist materials is provided. A positive first layer is deposited on a substrate and flood exposed before a subsequent layer of negative photoresist material is added on top of the positive photoresist material. An optional third layer of positive photoresist material may be added on top of the negative photoresist to provide the top layer. A window or aperture is provided in the top layer employing conventional mask, exposure and development techniques. The top of the bottom layer is plasma etched through the window or aperture so that the previously flood exposed bottom layer can be developed without affecting the layers deposited thereon. A deep undercut lift-off pattern is provided which is useful in the manufacture of Josephson junction devices employing low temperature metals as well as for the manufacture of semiconductor devices.

4 Claims, 14 Drawing Figures

ISOTROPIC DEVELOP BOTTOM LAYER →

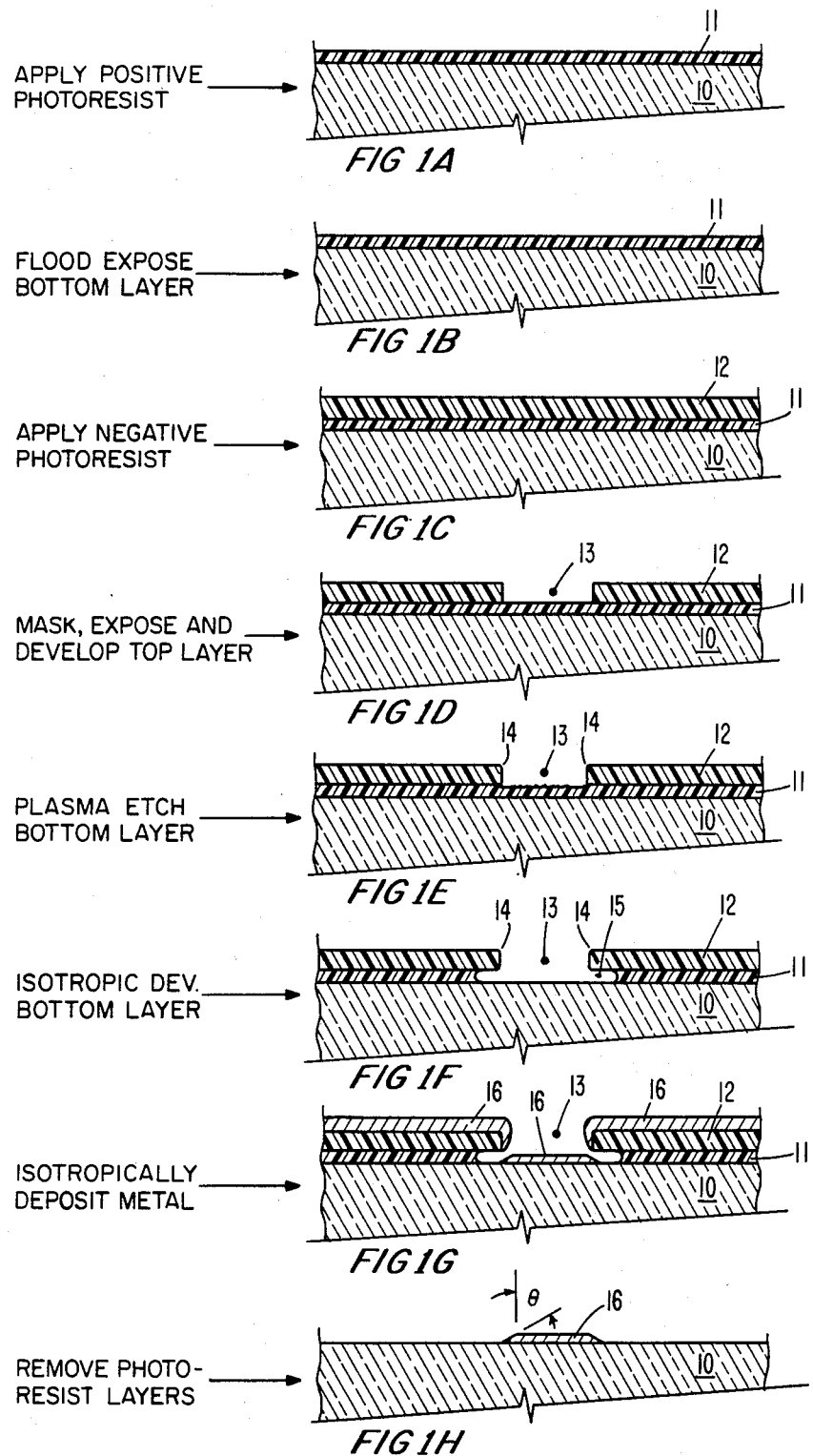

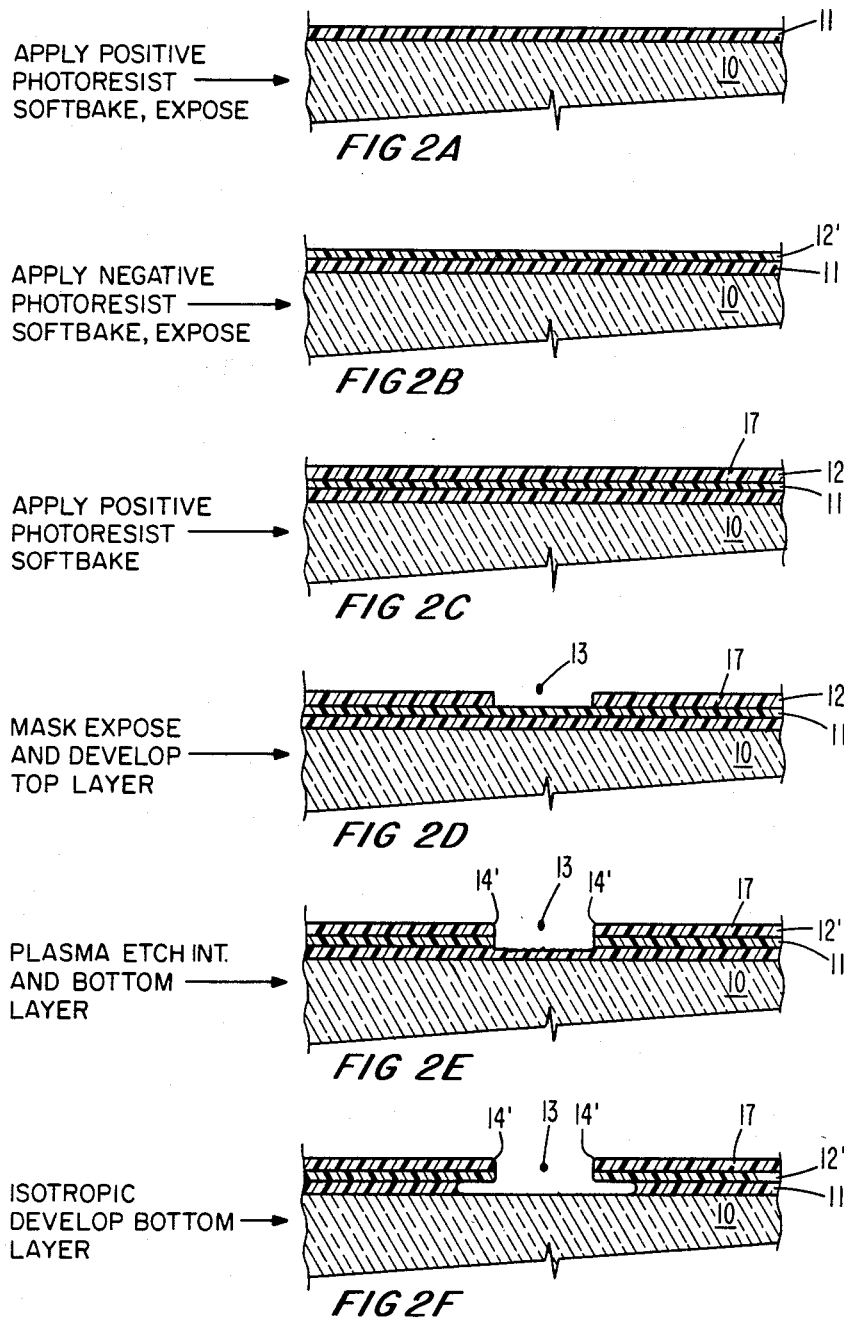

METHOD OF FORMING A LOW TEMPERATURE MULTILAYER PHOTORESIST LIFT-OFF PATTERN

BACKGROUND OF THE INVENTION

1. Field of the Invention

This invention relates to a new and improved method of making extremely accurate photoresist lift-off patterns having a deep undercut for use in the manufacture of Josephson junction superconducting devices. More particularly, this invention relates to an improved lift-off pattern which may be employed during isotropic vacuum deposition of low temperature superconducting metals such as lead, lead alloys of gold, indium and bismuth.

2. Description of the Prior Art

Additive metalization techniques, also known as "lift-off" techniques which employ lift-off patterns and lift-off masks were developed in the late 1960's. Such techniques were initially developed for use in vapor deposition of metals used in the manufacture of integrated circuit semiconductor devices. This prior art is largely classified in Class 427, subclasses 38, 88–91, 99 and 259 and also in Class 340, subclass 11. The book "Integrated Circuit Fabrication Techniques", by David J. Elliot, Copyright 1982 McGraw Hill, New York at pages 27 to 32 includes a summary of "metal lift-off" techniques.

Early multilayer lift-off pattern systems were designed for use in processes where the processing temperature exceeded 100° C. Processes which are employed in the manufacture of lead-base Josephson junction superconducting devices such as lead, lead alloys of gold, bismuth and indium have very thin oxide junctions which can be easily damaged when process temperatures exceeds 70° C.

U.S. Pat. No. 4,204,009 which is assigned to IBM, teaches a two layer photoresist lift-off system employing two separate layers of positive photoresist material in which a lift-off pattern is provided at low processing temperatures. The first positive layer of photoresist material is very thick and is unsaturated. The second positive photoresist layer is comparatively thin and is completely saturated. When the two layers are exposed as a laminate layer at the same time through a mask, the areas of both photoresist layers not covered by the mask are exposed to the collimated light source. When the exposed areas are developed, they are removed. Since the collimated light source is not perfectly polarized in a single axis, and the more dense and saturated upper layer of photoresist is less sensitive to the light source, there is more isotropic or edge diffusion of the light into the edges of the bottom layer when both layers are exposed as a laminar structure. Further, the edges of the bottom layer are more susceptable to light and are exposed to a greater degree. When the laminar structure is then developed, the bottom layer develops faster than the top layer and provides an undercut profile under the top layer in the same manner as would occur when chemically etching dissimilar metals. This IBM patent recognizes the temperature problems involved in the manufacture of Josephson junction superconductive devices and provides a low temperature process solution. However, the saturated photoresist which is employed must be specially mixed and specially filtered at the time of use. Further, the saturated photoresist material is quite sensitive to ambient temperatures. For example, as the temperature increases, the photoresist becomes less saturated. If the temperature drops, precipitation may occur in the saturated photoresist material. It is known that saturated photoresist materials have very low viscosity and must be applied in thin coatings. The process described in this IBM patent employs multiple thin coatings of saturated photoresist. When the top layer of photoresist material is made too thin, and a substantial undercut lift-off pattern is being made, the top layer will collapse. Further, since the bottom layer of the photoresist lift-off pattern is substantially thicker than the top layer, longer development time is required to achieve a desired undercut and this permits the developing solution to attack and develop the top thin layer at the edges thus destroying the accuracy of the pattern. The saturated photoresist will combine with and bleed into the unsaturated layer which changes the concentration of both layers at the interface boundary.

It would be desirable to provide a multilayer photoresist lift-off pattern which may be made at low processing temperatures and which maintains very high accuracy of the dimensions of the mask.

SUMMARY OF THE INVENTION

It is a primary object of the present invention to provide a more accurate lift-off pattern for use in the manufacture of Josephson junction superconducting devices.

It is another primary object of the present invention to provide a more accurate novel lift-off pattern having a controllable deep undercut.

It is another object of the present invention to provide a novel lift-off pattern which may be made at low temperatures for use in the manufacture of lead and lead alloy Josephson junction superconducting devices.

It is another object of the present invention to provide a novel method of making an accurate low temperature multilayer lift-off pattern for use in the manufacture of Josephson junction superconducting devices which employ low melting temperature superconducting metals.

It is another object of the present invention to provide a novel method of making accurate low temperature multilayer lift-off patterns employing commercially available standard unsaturated photoresist materials which do not require special processing or treatment.

It is yet another object of the present invention to provide a novel method of making accurate low temperature multilayer lift-off patterns which employ commercially available positive and negative photoresist materials in a multilayer lift-off pattern.

According to these and other objects of the present invention, there is provided a substrate on which is applied a positive photoresist material to form a bottom layer. The bottom layer is soft baked at a low temperature and then completely flood exposed. A second layer of negative photoresist material is applied over the exposed bottom layer which is soft baked before being masked and exposed and developed to provide an aperture in the top layer. The bottom layer is plasma etched through the aperture to remove the surface area which has been contaminated with the negative photoresist material. The now exposed bottom layer is isotropically developed so that the bottom layer positive photoresist material is developed beneath the negative photoresist material layer to provide a deep undercut lift-off pattern.

BRIEF DESCRIPTION OF THE DRAWINGS

FIG. 1A to 1H are partial diagramatic cross-sectional views in elevation taken through a substrate and showing a method of making the preferred embodiment two layer lift-off pattern according to the present invention; and FIGS. 2A to 2F are partial diagramatic cross-sectional views in elevation taken through a substrate showing a modified method of making a modified embodiment three layer lift-off pattern according to the present invention.

DESCRIPTION OF THE PREFERRED EMBODIMENT

The barrier junction oxide layer of a lead-base Josephson junction superconducting device is preferably only thirty to fifty angstroms in thickness. This delicately thin barrier junction layer (not shown) is deposited in and on the base electrode of a Josephson junction device. It is important to avoid fabrication temperatures in excess of 70° C. to prevent damage to this barrier junction oxide layer.

Josephson junction superconducting devices operate at superconducting temperatures between 15° K. and about 5° K. when not at room temperatures. The extreme change in temperature to which the devices are subjected creates stress concentrations at the step changes of the vacuum deposited metal and insulation layers as has been described in greater detail in the prior art and in our co-pending application S.N. 362,578 filed Mar. 26, 1982 Pat. No. 4,418,095, for "A Method of Making Planarized Josephson Junction Devices". To alleviate the problem of stress concentration at the step changes of the layers of a Josephson junction device, the base electrode bottom metal layer has been deposited in such a manner that the edges of the steps were sloped gradually. The edges of the base electrode which is vacuum deposited can be controlled by rotating the substrate during vacuum deposition or modifying the process of vacuum deposition to achieve a scattering or isotropic deposition effect. When the edges of the base electrode are provided with a gradual slope change, the amount of undercut required in the lift-off pattern increases exponentially. Thus, it is important to be able to control the process temperature, the amount of undercut in the lift-off pattern while preserving the accuracy of the edges of the top layer of the lift-off pattern.

Refer now to FIG. 1A showing a partial section of a substrate 10 which has been prepared for manufacture of a Josephson junction device. A first positive photoresist layer 11 (or bottom layer) is applied on top of the substrate 10 in a well known manner such as spin coating and then soft baking to harden the bottom positive photoresist layer 11.

FIG. 1B shows the same layers 10 and 11 as they would appear after being flood exposed to a collimated ultraviolet light which will render the exposed photoresist layer 11 soluble in a positive type developer. The positive photoresist bottom layer or first layer 11 is preferably made by spin coating an organic polymeric masking material such as phenol formaldehyde novalac resin which is commercially available from Shipley Corporation or Hoerchst Corporation designated AZ1350 type photoresist. The developer employed for developing this exposed photoresist is a compatible positive type developer.

FIG. 1C shows a second negative photoresist layer 12 applied on top of the first positive photoresist layer 11. In the preferred embodiment of FIG. 1, the second negative photoresist layer 12 will become the top layer. The top layer 12 is preferably soft baked to harden the layer before being processed as shown in FIG. 1D.

FIG. 1D shows the second negative photoresist layer 12 after it has been exposed through a negative mask with collimated ultraviolet light and then developed in a negative type compatible developer to provide a top layer 12 having an aperture or window 13 therein. The negative photoresist second layer 12 is preferably a polyisoprene polymer such as SELECTILUX sold by EM Chemicals Company (an associate of E. Merck of W. Germany). In the preferred embodiment shown, the bottom layer 11 is approximately 4,000 Å thick and the top layer 12 is approximately 5,000 to 7,000 Å thick. The structure shown in FIG. 1D is rinsed and dried before being plasma etched in a vacuum chamber to remove the top surface of the bottom layer 11 which has been contaminated and/or intermixed with the material comprising top layer 12. The step of plasma etching in an oxygen environment in a vacuum chamber is an isotropic process and causes some removal of the top corners 14 of the top layer 12. However, the dimensional accuracy of the window or aperture 13 is substantially unaffected because the amount of etching of the bottom layer 11 is intended to remove only a few hundred angstroms of the top portion of bottom layer 11.

FIG. 1F shows the structure of FIG. 1E after being developed in a positive type developer which is compatible with the bottom layer 11. The bottom layer 11 was previously flood exposed or exposed all over before the top layer 12 was applied. Since the total bottom layer 11 has been exposed, it is rendered susceptible to development by positive type compatible developer employed in the process step shown in FIG. 1F and the amount of undercut 15 can be controlled by controlling the time, temperature and concentration of the positive type developer which does not develop the negative type photoresist top layer 12. It will be noted that a substantially large undercut 15 is shown formed under the top photoresist 12. At this point in the process, the steps described hereinbefore have been performed at room temperature and/or at a temperature which may be defined as soft baked which does not exceed 70° C.

FIG. 1G shows the partially processed substrate 10 after it has been returned to a vacuum chamber (not shown) and a base electrode of low temperature metal 16 such as lead or lead base alloys including alloys of gold, indium and/or bismuth have been vacuum deposited. The preferred manner of deposition deposits metal under the ledge of the top photoresist layer 12 in a manner which causes a gentle slope at the edges. It will be understood that the usual form of vacuum deposition deposits materials on a line-of-sight from the evaporation source to the substrate. One modified form of vacuum deposition may be accomplished by offsetting the substrate and rotating the substrate simultaneously during deposition of the base electrode 16. Another way to provide gentle slope edges is to create inside of the vacuum chamber a partial pressure of inert gas between a preferred range of $10^{-1}$ to $10^{-3}$ torr. It has been found that this preferred range of inert gas pressure in a vacuum chamber during vacuum deposition of the base electrode causes a scattering effect of the metal being vacuum deposited so as to deposit the metal under the ledge of the top layer 12 of the lift-off pattern in a manner which provides a gentle slope up to 60° under the ledge of top layer 12.

After the base electrode material 16 is deposited through the aperture 13 of the lift-off pattern, the complete lift-off pattern and the base electrode material 16 deposited thereon may be removed by dissolving the bottom positive photoresist layer 11 in a compatible positive developer or solvent which leaves the negative top layer 12 with the material 16 thereon unaffected by the solvent or developer. Thus, the layer 12 with the layer 16 thereon is stripped or lifted off leaving the base electrode structue 16 as shown in FIG. 1H. Once the base electrode 16 is rinsed and dried, it may be processed further to provide appropriate insulation layers and an oxide junction barrier layer thereon.

Having explained in detail with reference to FIGS. 1A through 1H, the important process steps in making the novel lift-off pattern 11, 12, it will be understood that the accuracy of the aperture or window 13 may be held to an accuracy of one micron of the accuracy of the mask employed using the preferred embodiment two layer lift-off pattern described with reference to FIGS. 1A through 1H.

Refer now to FIGS. 2A through 2F which will be employed to describe a modified embodiment three layer lift-off pattern having slightly higher accuracy than the two layer lift-off pattern described with reference to FIGS. 1A through 1H. The first or bottom layer of photoresist material 11 is applied to the substrate 10 and soft baked before being flood exposed in the manner described hereinbefore with reference to FIG. 1A.

The second layer of negative photoresist material is applied on top of the positive photoresist layer 11 and is soft baked before being flood exposed. In this modified embodiment, the layer 12′ will become an intermediate layer rather than a top layer as shown in the FIG. 1 preferred embodiment. It will be understood that the layers 11 and 12′ should be individually soft baked but may be exposed at the same time after soft baking the second or intermediate layer 12′ as shown in FIG. 2B.

FIG. 2C shows the partially processed substrate 10 after a third, positive photoresist layer 17 is applied over the intermediate layer 12′. The top layer 17 is shown in FIG. 2D after being soft baked then exposed through a positive mask to ultraviolet light and developed in a compatible developer to provide the aperture or window 13. FIG. 2E shows the structure of FIG. 2D after being plasma etched to extend the aperture or window 13 through the intermediate layer 12′ and into the top portion of the bottom layer 11. The process of plasma etching the intermediate layer and bottom layer causes the top corners 14′ of top layer 17 to be etched but the side walls of the aperture 13 maintain their accuracy to a high degree. The accuracy of the dimensions of the aperture 13 may be held to better than one micron because the top layer 17 is a positive photoresist material which has higher resolution characteristics than the negative type photoresist materials. After the layers 11 and 12′ are plasma etched, the structure may be placed in a developer which is the type which will dissolve the flood exposed positive bottom photoresist layer 11 without effecting or dissolving the unexposed portions of top positive photoresist layer 13. The amount of undercut 15 can be controlled by the time, temperature and concentration of the developer employed.

The novel three layer positive-negative-positive photoresist lift-off pattern 11, 12′, 17 is employed in the same manner to achieve the same results described hereinbefore with reference to FIGS. 1G and 1H wherein a base electrode 16 may be vacuum deposited on the substrate 10 in a manner which provides a gentle slope angle theta ($\theta$) up to 60° so that insulation material and metals vacuum deposited thereon do not have abrupt or vertical step changes which would create stress concentrations that may form cracks due to thermal cycling or internal fatigue stresses. The top layer 17 is preferably made of the same photoresist material as the bottom layer 11.

Having explained a preferred embodiment two layer novel photoresist pattern and method and a modified three layer photoresist pattern and method, it will be understood that the structures shown in FIGS. 1 and 2 may be employed when vacuum depositing metal layers of the type employed in the manufacture of semiconductor integrated circuits as well as when depositing low temperature superconducting metals employed in the manufacture of Josephson junction superconducting devices and circuits.

I claim:

1. A method of forming a low temperature multilayer photoresist lift-off pattern below 70° C. comprising:
   providing a substrate,
   applying a positive photoresist bottom layer on said substrate,
   soft baking below 70° C. said positive photoresist bottom layer,
   exposing said positive photoresist bottom layer,
   applying a negative photoresist intermediate layer on said bottom layer,
   providing a positive photoresist top layer on said intermediate layer,
   masking, exposing and developing said top layer to provide an accurate aperture in said top layer.
   plasma etching an extended accurate aperture through said intermediate layer and partially etching into said bottom layer to expose said bottom layer in said extended aperture,
   isotropically developing said exposed bottom layer of said positive photoresist for a predetermined amount of time to provide a laterally extending deep undercut lift-off pattern under said intermediate layer, and
   rinsing and drying said substrate and said three layers to provide a deep accurate three layer lift-off pattern for precise deposition of metal through said extended accurate aperture.

2. A method of forming a low temperature multilayer photoresist pattern as set forth in claim 1 wherein said step of plasma etching comprises etching through said negative photoresist material layer and etching only the top portion of said bottom layer.

3. A method of forming a low temperature multilayer photoresist pattern as set forth in claim 1 which further includes the steps of depositing a metal electrode layer on top of said substrate in said aperture and on said top layer, and removing said deep undercut lift-off pattern.

4. A method of forming a low temperature multilayer photoresist pattern as set forth in claim 3 wherein said step of depositing a metal electrode comprises isotropically depositing said metal electrode to provide a gradual slope change at the edges which extends under said lift-off pattern.

* * * * *

UNITED STATES PATENT AND TRADEMARK OFFICE
CERTIFICATE OF CORRECTION

PATENT NO. : 4,533,624

DATED : Aug. 6, 1985

INVENTOR(S) : John E. Sheppard

DOCKET NO.: EM-2438

It is certified that error appears in the above-identified patent and that said Letters Patent is hereby corrected as shown below:

Col. 6, line 36, after "layer" the period (.) should read --,--

Col. 6, line 47, after "accurate" insert -- undercut --.

Signed and Sealed this

Nineteenth Day of November 1985

[SEAL]

Attest:

Attesting Officer

DONALD J. QUIGG

Commissioner of Patents and Trademarks